(12) United States Patent
Thaler et al.

(10) Patent No.: US 10,788,748 B2
(45) Date of Patent: Sep. 29, 2020

(54) METHOD AND APPLIANCE FOR PREDICTING THE IMAGING RESULT OBTAINED WITH A MASK WHEN A LITHOGRAPHY PROCESS IS CARRIED OUT

(71) Applicant: Carl Zeiss SMT GmbH, Oberkochen (DE)

(72) Inventors: Thomas Thaler, Jena (DE); Holger Seitz, Jena (DE); Ute Buttgereit, Jena (DE); Thomas Trautzsch, Jena (DE); Mame Kouna Top-Diallo, Veldhoven (NL); Christoph Husemann, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/197,658

(22) Filed: Nov. 21, 2018

(65) Prior Publication Data

US 2019/0107776 A1 Apr. 11, 2019

Related U.S. Application Data

(63) Continuation of application No. PCT/EP2017/062081, filed on May 19, 2017.

(30) Foreign Application Priority Data

Jun. 1, 2016 (DE) .......................... 10 2016 209 616

(51) Int. Cl.
*G06F 17/50* (2006.01)
*G03F 1/84* (2012.01)
(Continued)

(52) U.S. Cl.
CPC ............. *G03F 1/84* (2013.01); *G01N 21/956* (2013.01); *G03F 7/705* (2013.01)

(58) Field of Classification Search
USPC .................................. 716/51, 52, 53, 54, 55
See application file for complete search history.

(56) References Cited

U.S. PATENT DOCUMENTS 6,134,011 A * 10/2000 Klein ........................ G01J 4/04
250/225
9,478,019 B2 10/2016 Sezginer et al.
(Continued)

FOREIGN PATENT DOCUMENTS

| CN | 102834776 | 12/2012 | ............... G03F 7/20 |
| TW | 201337472 | 9/2013 | ............... G03F 7/20 |
| TW | 201602717 | 1/2016 | ............... G03F 1/84 |

OTHER PUBLICATIONS

German Office Action for German Application No. DE 10 2016 209 616.8, dated Mar. 14, 2017.
(Continued)

*Primary Examiner* — Brian Ngo
(74) *Attorney, Agent, or Firm* — Fish & Richardson P.C.

(57) ABSTRACT

The invention relates to a method and an appliance for predicting the imaging result obtained with a mask when a lithography process is carried out, wherein the mask comprises mask structures to be imaged and the mask is destined to be illuminated in a lithography process in a projection exposure apparatus with a predetermined illumination setting for exposing a wafer comprising a photoresist. In accordance with one aspect of the invention, a method according to the invention comprises the following steps: measuring at least one intensity distribution obtained for the mask in the case of an illumination with illumination light in accordance with the illumination setting in a mask inspection apparatus using a sensor arrangement, ascertaining an electric field resulting from the interaction of the illumination light with the mask structures, both in respect of amplitude and in respect of phase, by way of this intensity
(Continued)

measurement, and estimating an intensity distribution obtained in the photoresist when the lithography process is carried out on the basis of a mathematical simulation (forward calculation), in which the electric field ascertained is propagated in a layer system comprising at least the photoresist.

26 Claims, 4 Drawing Sheets

(51) Int. Cl.
*G03F 7/20* (2006.01)
*G01N 21/956* (2006.01)

(56) References Cited

U.S. PATENT DOCUMENTS

| | | | |
|---|---|---|---|
| 9,547,892 B2 | 1/2017 | Shi et al. | |
| 2010/0162199 A1 | 6/2010 | Liu et al. | |
| 2012/0134542 A1 | 5/2012 | Pang et al. | |
| 2012/0320358 A1 | 12/2012 | Ruoff | |
| 2013/0204594 A1 | 8/2013 | Liu | |
| 2013/0222779 A1 | 8/2013 | Finders | |
| 2015/0324963 A1 | 11/2015 | Sezginer et al. | |
| 2016/0012579 A1* | 1/2016 | Shi | G06T 7/001 382/149 |
| 2017/0016821 A1* | 1/2017 | Unlu | G01N 21/554 |
| 2019/0107776 A1 | 4/2019 | Thaler et al. | |

OTHER PUBLICATIONS

Taiwan Office Action for Taiwan Patent Application No. 106116647 dated Apr. 20, 2018.
Search Report for Taiwan Patent Application No. 106116647 dated Apr. 12, 2018.
International Preliminary Report on Patentability for International Application No. PCT/EP2017/062081 dated Dec. 13, 2018.
Fienup: "Phase retrieval algorithms: a comparison", *Applied Optics*, vol. 21, No. 15, pp. 2758-2769, (Aug. 1, 1982).
Granik et al., "New Process Models for OPC at sub-90nm Nodes", *Deep Submicron Technical Publications*, May 2003.
Jingshan et al.: "Partially coherent phase imaging with simultaneous source recovery", Biomedical Optics Express, vol. 6, No. 1, pp. 257-265 (Jan. 1, 2015).
Sagiv et al.: "Computational Inspection Applied to a Mask Inspection System with Advanced Aerial Imaging Capability", *Photomask and Next-Generation Lithography Mask Technology XVII*, Proc. of SPIE, vol. 7748, pp. 77480P-1-77480P-12 (2010).
Shanker et al.: "Critical Assessment of the Transport of Intensity Equation as a phase recovery technique in optical lithography", *Optical Microlithography XXVII*, Proc. SPIE, vol. 9052, pp. 90521D-1-90521D-10 (2014).
Van den Broek et al., "General framework for quantitative three-dimensional reconstruction from arbitrary detection geometries in TEM", *Physical Review*, vol. B87, pp. 184108-; Phys. Rev. B 87, 184108-1-104108-11 (2013).
Wang et al., "Spatial light interference microscopy (SLIM)", *Optics Express*, vol. 19, No. 2, p. 1016-1026 (Jan. 17, 2011).
Wen et al.: "Subnanoradian X-ray phase-contrast imaging using a far-field interferometer of nanometric phase gratings", *Nature Communications*, DOI:10.1038/ncomms3659 (Nov. 5, 2013).
Claus et al., "Effect of Amplitude Roughness on EUV Mask Specification", *Photomask Technology 2014*, Proceedings of SPIE, vol. 9235, pp. 92351A-1-92351A-6 (Oct. 8, 2014).
Conrad et al., "Model Considerations, Calibration Issues, and Metrology Methods for Resist-Bias Models", *Proceedings of SPIE*, vol. 3677 (Jun. 1999).
Kim et al., "Optical properties of a thin film stack illuminated by a focused field", *J. Opt. Soc. Am. A*, vol. 17, No. 8, pp. 1454-1460 (Aug. 2000).
Pierrat, "Evaluation of a New Model of Mask Topography Effects", *Optical Microlithography XXIV*, Proceedings of SPIE, vol. 7973, pp, 797317-1-797317-9 (Mar. 23, 2011).
Tumbar, et al., "Wave-Front Sensing with a Sampling Field Sensor", *Applied Optics*, vol. 39, No. 1, pp. 72-84 (Jan. 1, 2000).
Zheng et al., "Wide-field, high-resolution Fourier ptychographic microscopy", *Nature Photonics*, vol. 7, pp. 739-745 (2013).
PCT Notification of Transmittal of International Search Report and the Written Opinion of the International Searching Authority for International Application No. PCT/EP2017/062081 dated Oct. 27, 2017.
The Taiwan Office Action and Search Report for Taiwan Patent Application No. 108110512 dated Nov. 22, 2019 (with English Translation).
Schnars et al., "Digital Holography," Springer-Verlag Berlin Heidelberg (2005), pp. 20-69.

\* cited by examiner

METHOD AND APPLIANCE FOR PREDICTING THE IMAGING RESULT OBTAINED WITH A MASK WHEN A LITHOGRAPHY PROCESS IS CARRIED OUT

CROSS REFERENCE TO RELATED APPLICATIONS

This application is a continuation of and claims priority under 35 U.S.C. § 120 from PCT Application No. PCT/EP2017/062081, filed on May 19, 2017, which claims priority from German Application No. DE 10 2016 209 616.8, filed on Jun. 1, 2016. The entire contents of each of these priority applications are incorporated herein by reference.

TECHNICAL FIELD

The invention relates to a method and an appliance for predicting the imaging result obtained with a mask when a lithography process is carried out.

BACKGROUND

Microlithography is used for producing microstructured components such as, for example, integrated circuits or LCDs. The microlithography process is carried out in a so-called projection exposure apparatus comprising an illumination device and a projection lens. The image of a mask (reticle) illuminated by use of the illumination device is in this case projected by means of the projection lens onto a substrate (for example a silicon wafer) coated with a light-sensitive layer (photoresist) and arranged in the image plane of the projection lens, in order to transfer the mask structure to the light-sensitive coating of the substrate.

Unwanted defects on the mask have a particularly disadvantageous effect in the lithography process as these defects may be reproduced in each exposure step and hence, in a worst-case scenario, there is the risk of the entire output of semiconductor components being unusable. Therefore, it is very important to check the mask has a sufficient imaging capability prior to the use thereof within the scope of mass production.

Therefore, there is a need for quickly and easily testing the mask, to be precise under the same conditions as are actually present in the projection exposure apparatus where possible. The use of a mask inspection apparatus to this end is known, said mask inspection apparatus in turn comprising an illumination system and a projection lens, with the illuminated region of the mask being imaged on a sensor arrangement such as e.g. a CCD camera by use of the projection lens.

The problem occurring in practice is that, inter alia, the imaging result ultimately arising as a result of the lithography process on the wafer, or in the light-sensitive layer thereof (photoresist), in the projection exposure apparatus still differs from the result predicted on the basis of the intensity measurement undertaken in the mask inspection apparatus by use of the sensor arrangement. In particular, this can be traced back to the fact that the imaging result obtained as a result of the lithography process on the wafer, or in the light-sensitive layer thereof (photoresist), is subject to various influences which have not been reproduced in the mask inspection apparatus, said influences, in addition to the chemical properties of the photoresist itself, also including an immersion medium, possibly present upstream of the wafer, with a deviating refractive index and a structure of the wafer made of a plurality of layers with different optical conditions and interfaces resulting therefrom, which influence the intensity distribution in the photoresist by way of the reflections that occur (possibly also standing waves).

SUMMARY

Against the aforementioned background, in a general aspect, the present invention provides a method and an appliance for predicting the imaging result obtained with a mask when a lithography process is carried out, by means of which method and appliance a prediction of the imaging result arising on the wafer as a result of the lithography process which is as accurate as possible is facilitated.

Features of the method are recited in the independent claims.

In principle, methods for determining the electric field, both in terms of amplitude and in terms of phase, from the intensity measurement (or the measurement of an aerial image) undertaken with the sensor arrangement are known, said electric field arising in the mask inspection apparatus from an interaction of the illumination light with the mask structures.

Proceeding herefrom, the invention in accordance with one aspect is now based on the further concept of propagating the complete amplitude and phase information of the electric field resulting from the interaction of the illumination light with the mask structures into a system comprising, in particular, the photoresist (and also an immersion medium and/or a wafer stack in further embodiments) by way of a mathematical simulation in order thus to arrive at a precise prediction of the intensity distribution actually arising in the photoresist for the specific mask.

The invention further comprises the concept of predicting the final photoresist structure in the photoresist on the basis of an OPC (OPC=Optical Proximity Correction) model or resist model when proceeding from the intensity distribution ascertained as described above. Here, the OPC model or resist model describes the difference between the intensity distribution in the photoresist and the final resist structure, which emerges on account of the chemical properties of the photoresist. Hence, this allows a more accurate prediction in respect of how the final structure resulting from the chemical processes occurring during the lithography process will look like, based on the previously recorded aerial image of the (actually measured) mask using the resist model.

The mask may be a mask designed for operation in transmission, in particular at an operating wavelength of less than 250 nm, or else a mask designed for operation in reflection, in particular at an operating wavelength of less than 30 nm.

The invention further contains the concept of using the complete amplitude and phase information of the electric field, resulting from the interaction of the illumination light with the mask structures, in combination with the likewise known illumination conditions, at which this electric field arose in the mask inspection apparatus, for the purposes of a ("back") calculation of a mask model of the mask which supplies a general description of the refractive behavior of the mask (in the case of a mask designed for operation in transmission) or of the reflective behavior of the mask (in the case of a mask designed for operation in reflection).

In order now to ascertain how the result of the lithography process would look like for modified illumination conditions, it is possible, according to the invention, to calculate how the ascertained mask model reacts to specific changed illumination conditions (i.e. there is a purely mathematical change in the illumination conditions, for example as a consequence of a transition from a numerical aperture (NA) of NA=1.35 to NA=1.2 or a transition to a different illumination setting). Expressed differently, the prediction of the imaging result obtained with a specific mask for modified illumination conditions in the projection exposure apparatus is carried out on the basis of the knowledge of the electric field resulting from the interaction of the illumination light with the mask structures and the refractive or reflective behavior of the mask.

The invention further contains the concept of making a prediction of the imaging result obtained with the specific mask for modified focal positions in the projection exposure apparatus. Here, there may be, once again, a prediction of the imaging result obtained with the specific mask for modified (not previously measured) focal positions in the projection exposure apparatus by simulation on the basis of the knowledge of the electric field resulting from the interaction of the illumination light with the mask structures, on the basis of the mask model described above and on the basis of carrying out a multiplicity of intensity measurements for different focal planes.

The invention further contains the concept of removing unavoidable aberrations, which arise in the mask inspection apparatus or which are caused by the optical components used therein and which contribute to the result of the intensity measurement carried out with the sensor arrangement, from the electric field resulting from the interaction of the illumination light with the mask structures by calculation with knowledge of these aberrations, as a result of which, ultimately, an aberration-free image may be produced on the basis of the measurement in the mask inspection apparatus. Furthermore, with knowledge of the aberrations occurring at the sides of the projection exposure apparatus, these aberrations (i.e. those of the microlithographic projection exposure apparatus) may be added to the aerial image measured in the mask inspection apparatus in order to achieve a further optimization of the prediction of the imaging result arising as a consequence of the lithography process on the wafer.

In accordance with one aspect, the invention relates to a method for predicting the imaging result obtained with a mask when a lithography process is carried out, wherein the mask comprises mask structures to be imaged and the mask is destined to be illuminated in a lithography process in a projection exposure apparatus with a predetermined illumination setting for exposing a wafer comprising a photoresist, wherein the method comprises the following steps:
  measuring at least one intensity distribution obtained for the mask in the case of an illumination with illumination light in accordance with the illumination setting in a mask inspection apparatus using a sensor arrangement;
  ascertaining an electric field resulting from the interaction of the illumination light with the mask structures, both in respect of amplitude and in respect of phase, by way of this intensity measurement; and
  estimating an intensity distribution obtained in the photoresist when the lithography process is carried out on the basis of a mathematical simulation (forward calculation), in which the electric field ascertained is propagated in a layer system comprising at least the photoresist.

In accordance with an embodiment, the layer system further comprises a wafer stack made of a plurality of layers forming the wafer.

In accordance with an embodiment, the layer system further comprises an immersion medium.

In accordance with an embodiment, the method further comprises the following step: predicting a final photoresist structure as a result of the lithography process on the basis of the estimated at least one intensity distribution and on the basis of an OPC model or resist model.

In accordance with an embodiment, ascertaining the electric field resulting from the interaction of the illumination light with the mask structures comprises the taking account of optical aberrations of the mask inspection apparatus.

In accordance with an embodiment, estimating the intensity distribution obtained in the photoresist when the lithography process is carried out comprises the taking account of optical aberrations of the projection exposure apparatus.

In accordance with an embodiment, the electric field is ascertained as a partly coherent complex electric field.

In accordance with an embodiment, the method further comprises the following step: calculating at least one parameter which characterizes the mask, on the basis of the ascertained electric field. According to the invention, there is no need, in particular, to use any calibration mask or further assumptions or models for qualifying the mask.

The invention further relates to a method for inspecting masks, wherein the mask comprises mask structures to be imaged and the mask is destined to be illuminated in a lithography process in a projection exposure apparatus with a predetermined illumination setting for exposing a wafer comprising a photoresist, wherein the method comprises the following steps:
  measuring at least one intensity distribution obtained for the mask in the case of an illumination with illumination light in accordance with the illumination setting in a mask inspection apparatus using a sensor arrangement;
  ascertaining an electric field resulting from the interaction of the illumination light with the mask structures, both in respect of amplitude and in respect of phase, by way of this intensity measurement; and
  calculating at least one parameter which characterizes the mask, on the basis of the ascertained electric field.

In accordance with an embodiment, the at least one parameter which characterizes the mask describes the form or position of structures on the mask. In particular, this may relate to the etching depth, the edge steepness, the edge rounding, the corner rounding or the line width variance, as well as the type of the structure and the immediate surroundings thereof.

In accordance with an embodiment, ascertaining an electric field resulting from the interaction of the illumination light with the mask structures comprises the taking account of optical aberrations of the mask inspection apparatus.

In accordance with an embodiment, the method comprises the following step: calculating a mask model describing the refraction and/or reflection behavior of the mask on the basis of the ascertained electric field.

In accordance with an embodiment, the method further comprises the following step: estimating an intensity distribution obtained in the photoresist when the lithography process is carried out, for an illumination setting which deviates from the predetermined illumination setting.

In accordance with an embodiment, the method further comprises the following step: estimating an intensity distribution obtained in the photoresist when the lithography process is carried out, for a modified focal plane in the projection exposure apparatus.

In accordance with an embodiment, the method further comprises the following step: calculating at least one further intensity distribution, which is to be expected for the mask in the mask inspection apparatus when at least one optical parameter is changed.

The invention further relates to a method for inspecting masks, wherein the mask comprises mask structures to be imaged and the mask is destined to be illuminated in a lithography process in a projection exposure apparatus with a predetermined illumination setting for exposing a wafer comprising a photoresist, wherein the method comprises the following steps:

measuring at least one intensity distribution obtained for the mask in the case of an illumination with illumination light in accordance with the illumination setting in a mask inspection apparatus using a sensor arrangement;

ascertaining an electric field resulting from the interaction of the illumination light with the mask structures, both in respect of amplitude and in respect of phase, by way of this intensity measurement; and calculating at least one further intensity distribution, which is to be expected for the mask in the mask inspection apparatus when at least one optical parameter is changed.

In accordance with an embodiment, this at least one optical parameter describes the illumination setting used in the mask inspection apparatus.

In accordance with an embodiment, the change of at least one optical parameter comprises the taking account of optical aberrations of the mask inspection apparatus and/or of the projection exposure apparatus.

The invention further relates to an appliance for predicting the imaging result obtained with a mask when a lithography process is carried out or for inspecting masks, wherein the mask comprises mask structures to be imaged and the mask is destined to be illuminated in a lithography process in a projection exposure apparatus with a predetermined illumination setting for exposing a wafer comprising a photoresist, characterized in that the appliance is designed to carry out a method comprising the features described above.

The invention is realizable both in EUV (i.e. at wavelengths of e.g. approximately 13 nm or approximately 7 nm) and in the VUV or DUV range (e.g. at wavelengths of less than 250 nm, in particular of less than 200 nm). Hence, the mask inspected in the mask inspection apparatus may be both a reflecting reticle (destined for an EUV projection exposure apparatus) and a transmitting reticle (destined for a projection exposure apparatus in the DUV or VUV range).

Further configurations of the invention can be gathered from the description and the dependent claims.

Below, the invention is explained in more detail on the basis of preferred exemplary embodiments, with reference being made to the attached drawings.

DETAILED DESCRIPTION

Figure 1:
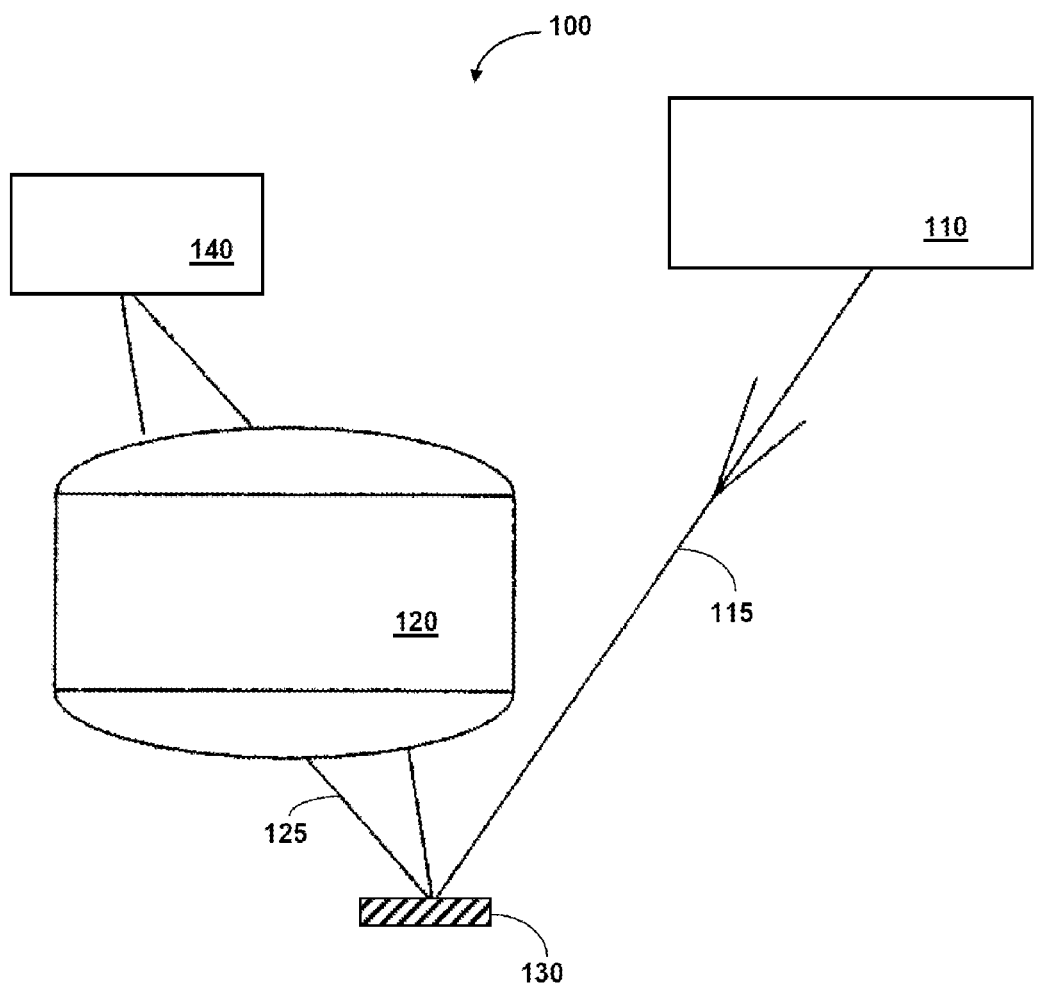
FIG. 1 shows a schematic illustration of the basic possible construction of a mask inspection apparatus which is used in the method according to the invention.

As depicted merely schematically in FIG. 1, a conventional mask inspection apparatus 100 comprises an illumination system 110 and a projection lens 120, wherein light from a light source (not depicted in FIG. 1) enters into the illumination system 110 and an illumination pencil of rays 115 impinges on a mask 130 arranged in the object plane of the projection lens 120 and wherein the illuminated region of the mask 130 is imaged by way of an observation pencil of rays 125 onto a sensor arrangement 140, e.g. a CCD camera, by use of the projection lens 120.

Moreover, a basic possible construction of a microlithographic projection exposure apparatus is explained with reference to FIG. 2. The projection exposure apparatus comprises an illumination device 210 and a projection lens 220. The illumination device 210 serves to illuminate a structure-carrying mask (reticle) 230 with light from a light-source unit 201, which e.g. comprises an ArF excimer laser for an operating wavelength of 193 nm and a beam shaping optical unit producing a parallel light beam. The illumination device 210 comprises an optical unit 211 which, inter alia, comprises a deflection mirror 212 in the depicted example. The optical unit 211 may comprise, e.g., a diffractive optical element (DOE) and a zoom-axicon system for producing different illumination settings (i.e. intensity distributions in a pupil plane of the illumination device 210). A light mixing device (not depicted here) is situated in the beam path downstream of the optical unit 211 in the light propagation direction, which light mixing device may have, e.g., in a manner known per se, an arrangement made of micro-optical elements which is suitable for obtaining a light mixture, and a lens group 213, downstream of which there is a field plane with a reticle masking system (REMA), which is imaged by a REMA lens 214, following in the light propagation direction, onto the structure-carrying mask (reticle) 230 which is arranged in a further field plane and which thereby delimits the illuminated region on the reticle.

By use of the projection lens 220, the structure-carrying mask 230 is imaged onto a substrate provided with a light-sensitive layer (photoresist) or onto a wafer 240. In particular, the projection lens 220 may be designed for immersion operation, in which case an immersion medium is situated upstream of the wafer, or the light-sensitive layer thereof, in relation to the light propagation direction. Further, it may have e.g. a numerical aperture NA greater than 0.85, in particular greater than 1.1.

Even though a possible construction of a microlithographic projection exposure apparatus designed for operation at wavelengths in the DUV (e.g. wavelengths of less than 250 nm, in particular of less than 200 nm) was described above, the invention is also applicable in further embodiments to a microlithographic projection exposure apparatus designed for operation at wavelengths in the EUV (e.g. wavelengths of less than 30 nm, in particular less than 15 nm) or to the prediction of the imaging result obtained with a mask when a lithography process is carried out in such a projection exposure apparatus.

Figure 2:
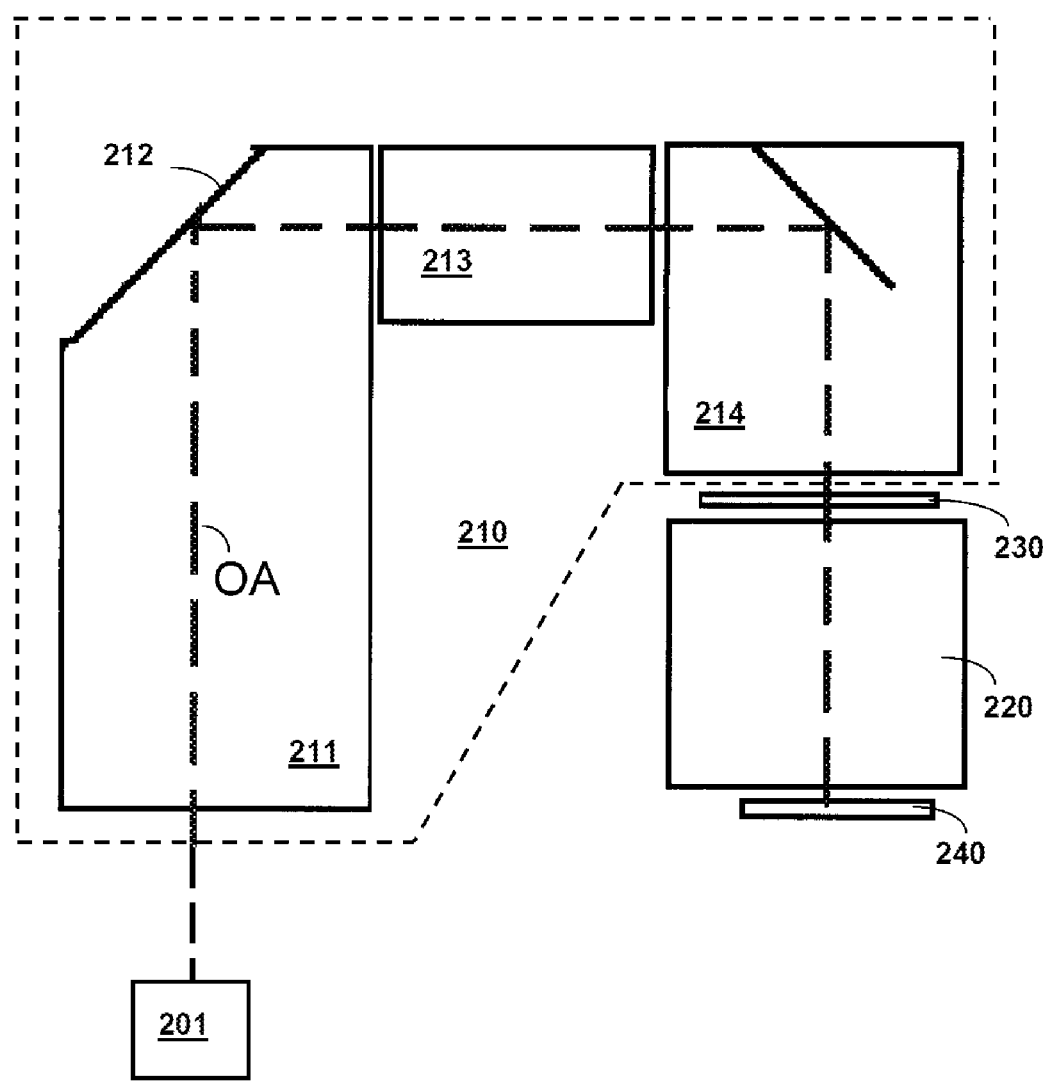
FIG. 2 shows a schematic illustration for explaining an exemplary construction of a microlithographic projection exposure apparatus.

In order to make a prediction of the imaging result obtained with a mask when the lithography process is carried out in the projection exposure apparatus of FIG. 2, there initially is the measurement of an intensity distribution obtained for the mask in the mask inspection apparatus of FIG. 1 or with the sensor arrangement 140. Here, the same illumination conditions which are also used in the projection exposure apparatus during the lithography process are set in the mask inspection apparatus.

In the next step, the electric field resulting from the interaction of the illumination light with the mask structures is ascertained, both in respect of amplitude and in respect of phase, by way of this intensity measurement. Here, the amplitude of the electric field emerges immediately as square root of the measured intensity. The phase of the electric field may be ascertained using the concept of intensity transport, known per se, which is describable by the following Equation (1):

$$\frac{\partial}{\partial \xi} I(x, y, \xi) = -\frac{1}{2\pi n} \nabla_\perp (I(x, y, \xi_0) \nabla_\perp \phi(x, y, \xi_0)) \quad (1)$$

where $\xi = \lambda \cdot z$. Here, the derivative of the intensity may be determined approximately by way of the difference between at least two measured intensity distributions. The equation describing the transport of the intensities then is a differential equation, from which the phase $\phi(x,y,\xi_0)$ is determined in the case of the known variables $I(x,y,\xi_0)$ and $$\frac{\partial}{\partial \xi} I(x, y, \xi).$$

This is based on a paraxial approximation in each case.

In further embodiments, the phase of the electric field resulting from the interaction of the illumination light with the mask structures may also be ascertained using the concept, likewise known, of ptychography. In this respect, reference is made to the article G. Zheng et al.: "Wide-field, high-resolution Fourier ptychographic microscopy", Nature Photonics Volume 7, pages 739-745 (2013), DOI: 10.1038/nphoton.2013.187.

Thereupon, the intensity distribution obtained in the photoresist on the wafer 240 when the lithography process is carried out in the projection exposure apparatus of FIG. 2 is estimated on the basis of a mathematical simulation (forward calculation), in which the previously ascertained electric field is propagated into a layer system, which comprises at least the photoresist, optionally additionally an immersion medium and/or a stack made of a plurality of the layers forming the wafer.

In respect of the mathematical description of a possible procedure, reference is made to the publication Seong-Sue Kim et al.: "Optical properties of a thin film stack illuminated by a focused field", J. Opt. Soc. Am. A/Vol. 17, No. 8/August 2000, p. 1454-1460. Accordingly, initially, the Fresnel coefficients in s- and p-polarization are specified below for the propagation into the j+1-th layer (1<j+1≤N) for a layer system made of a number N of layers:

$$r_{j+1}^s = \frac{Y_j m_{11} + Y_j Y_{N+1} m_{12} - m_{21} - Y_{N+1} m_{22}}{Y_j m_{11} + Y_j Y_{N+1} m_{12} + m_{21} + Y_{N+1} m_{22}}, \quad (2)$$

$$t_{j+1}^s = \frac{2Y_j}{Y_j m_{11} + Y_j Y_{N+1} m_{12} + m_{21} + Y_{N+1} m_{22}}$$

$$r_{j+1}^p = \frac{-Y_j m_{11} - Y_j Y_{N+1} m_{12} + m_{21} + Y_{N+1} m_{22}}{Y_j m_{11} + Y_j Y_{N+1} m_{12} + m_{21} + Y_{N+1} m_{22}} \quad (3)$$

$$t_{j+1}^p = \frac{n_j}{n_{v+1}} \frac{2Y_{N+1}}{Y_j m_{11} + Y_j Y_{N+1} m_{12} + m_{21} + Y_{N+1} m_{22}}$$

Here, $m_{11}$, $m_{12}$, $m_{21}$ and $m_{22}$ are the elements of the characteristic matrix:

$$\begin{bmatrix} m_{11} & m_{12} \\ m_{21} & m_{22} \end{bmatrix} = \tilde{M} = \tilde{M}_{j+1} \tilde{M}_{j+2} \ldots \tilde{M}_N \quad (4)$$

where $$\tilde{M}_{j+1} = \begin{bmatrix} \cos(k_0 h_{j+1}) & -\frac{i\sin(k_0 h_{j+1})}{Y_{j+1}} \\ -Y_{j+1} i\sin(k_0 h_{j+1}) & \cos(k_0 h_{j+1}) \end{bmatrix} \quad (5)$$

where the following applies:

$$h_{j+1} = n_{j+1} d_{j+1} \cos\theta_{j+1} \quad (6)$$

$$Y_{j+1} = \sqrt{\varepsilon_0/\mu_0}\, n_{j+1} \cos\theta_{j+1} \quad (7)$$

for s-polarization $$Y_{j+1} = \sqrt{\varepsilon_0/\mu_0}\, \frac{n_{j+1}}{\cos\theta_{j+1}} \quad (8)$$

for p-polarization

Here, θ denotes the angle of incidence, $\varepsilon_0$ denotes the permittivity and $\mu_0$ denotes the magnetic permeability.

In a further configuration of the method, it is also possible to predict, on the basis of the described estimation of the intensity distribution in the photoresist, the final photoresist structure which emerges on account of the chemical properties of the photoresist after the lithography process has been carried out, with use being made of an OPC model or resist model. In this respect, reference is made to the article Edward W. Conrad et al.: "Model considerations, calibration issues and metrology methods for resist-bias models", Proceedings of SPIE—June/1999; DOI:10.1117/12.350782, published in Proceedings Volume 3677: Metrology, Inspection and Process Control for Microlithography XIII June 1999.

In a further configuration of the method, the complete amplitude and phase information of the electric field, resulting from the interaction of the illumination light with the mask structures, can be used in combination with the likewise known illumination conditions, at which this electric field arose in the mask inspection apparatus, for the purposes of a ("back") calculation of a mask model of the mask which supplies a general description of the refractive behavior of the mask (in the case of a mask designed for operation in transmission) or of the reflective behavior of the mask (in the case of a mask designed for operation in reflection). On the basis of this mask model, it is possible, in turn, to estimate the result of the lithography process obtained by the mask for deviating illumination settings or deviating focal positions.

In a further configuration of the method, it is also possible to remove known aberrations, which arise in the mask inspection apparatus, from the electric field, which results from the interaction of the illumination light with the mask structures, by calculation in order ultimately to produce an aberration-free image on the basis of the measurement in the mask inspection apparatus. Moreover, it is also possible to add aberrations, which are known to occur in the microlithographic projection exposure apparatus, to the aerial image measured in the mask inspection apparatus in order to achieve a further optimization of the prediction of the imaging result arising on the wafer as a consequence of the lithography process.

In accordance with a further aspect of the invention, described below with reference to FIG. 3 and FIG. 4, the electric field resulting from the interaction of the illumination light with the mask structures is ascertained as a partly coherent, complex electric field. This is understood to mean an electric field which has a multiplicity of different amplitudes and phases, wherein the individual amplitude and phase values respectively apply for a coherent constituent or a specific location in the pupil plane of the illumination device.

According to the invention, this approach, for the purposes of which a suitable algorithm is described below with reference to FIG. 4, takes account of the fact that, firstly, the concept of describing an electric field by the physical variables of "phase" and "amplitude" only has validity in the coherent case and, secondly, a partly coherent illumination setting (e.g., a dipole or quadrupole illumination setting) should be assumed in relevant applications for the illumination setting to be emulated, which is used in the actual lithography process in the projection exposure apparatus.

Proceeding from this deliberation, the invention is based on the concept of obtaining an accuracy which is also sufficient for the respective illumination settings which are relevant in practice and thus—as one of several possible applications of the present invention—of facilitating, in particular, deductions about mask parameters by way of ascertaining the electric field as a complex, partly coherent field as described below.

Figure 4:
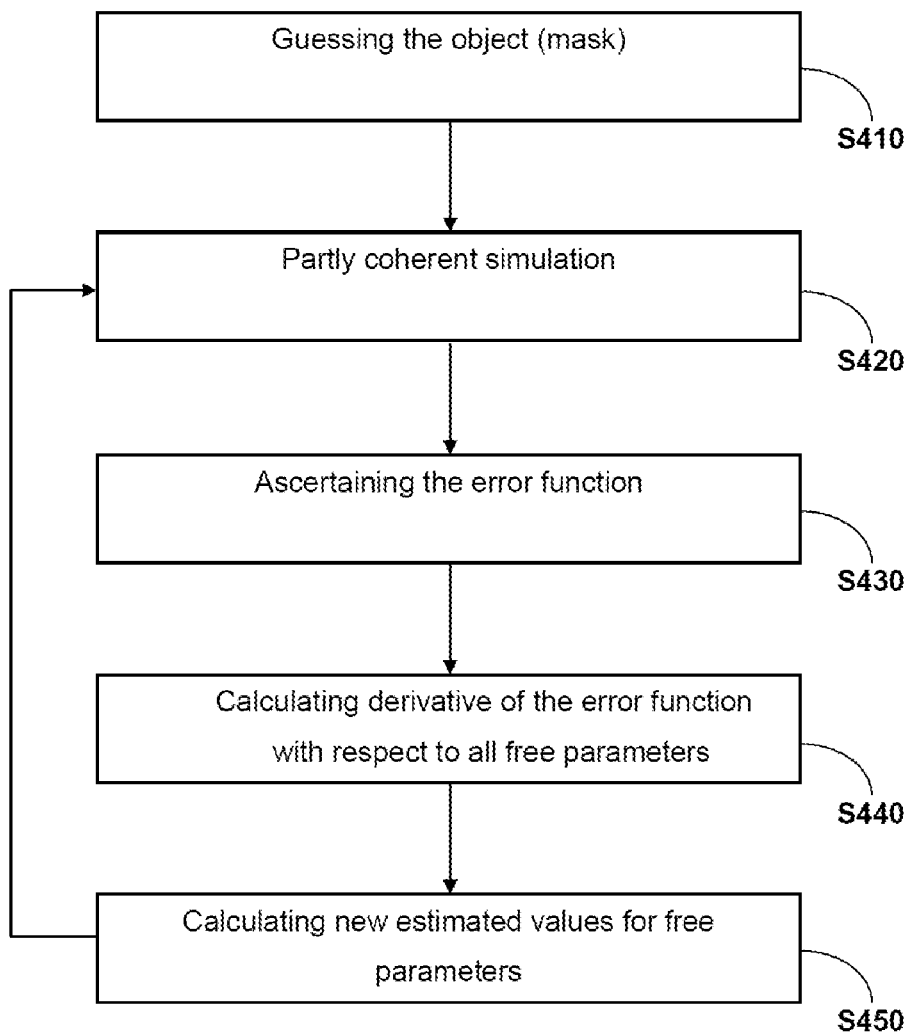
FIG. 4 shows a flowchart for explaining the procedure of an algorithm carried out in the method of FIG. 3.

Said algorithm, which may also be referred to as a partly coherent reconstruction algorithm, starts by guessing the object (the mask) and optionally further free parameters in step S410 in accordance with the flowchart depicted in FIG. 4. Here, it is possible, in particular, to obtain a first estimate of the object by solving the so-called TIE equation (i.e. on the basis of the known concept of the transport of intensities) (without, however, the invention being restricted thereto). Moreover, a first estimate of the object may be carried out on the basis of the design clip information or measured intensity values.

Now, a partly coherent simulation is carried out for the first time in step S420 for this object which was guessed in accordance with step S410. Here, a corresponding aerial image stack is simulated on the basis of the known, predetermined partly coherent illumination setting, the guessed object and possibly further guessed free parameters from step S410, which aerial image stack would correspond to the measured aerial image stack if the object and the further free parameters were guessed correctly. This aerial image stack may contain aerial images with different mask positions or different distances between mask and sensor arrangement and/or aerial images for different illumination settings.

In the next step S430, there is ascertainment of the error function as a sum of the square deviation between simulation and measurement of all pixels of the aerial image stack. The derivative with respect to all free parameters is calculated for this error function in the subsequent step S440. If the aforementioned simulation is able to be carried out using a Kirchhoff simulation, calculating said derivative of the error function may be carried out in a numerically efficient manner by way of a "backpropagation algorithm" known per se, with reference in respect of the prior art being made to the publication in Physical Review B 87, 184108 (2013): "*Backpropagation algorithm applied to 3D ptychography in electron microscopy*".

In the subsequent step S450, new estimated values are calculated for all free parameters and upon a corresponding return to step S420, a new partly coherent simulation is carried out, etc.

Hence, the reconstruction according to the invention of a virtual mask or of a virtual object is carried out in such a way that a simulation of this virtual object would ultimately reproduce the same measurement data as obtained with the mask inspection apparatus.

In embodiments of the invention, it is possible to carry out so-called "down sampling" (i.e. a reduction in the number of nodes used during the further combination by calculation in relation to the number of measured pixels) in order to increase the speed of the algorithm described above, wherein use may be made of the circumstances that the relevant physical information is representable by a smaller number of pixels than are present in the measured image provided by the mask inspection apparatus.

Further, the position and/or polarization of the illumination setting may also belong to the "reconstructed free parameters" in the algorithm of FIG. 4, as described above, in embodiments of the invention, and so, e.g., a displacement of the illumination poles, possibly occurring in the illumination setting, may likewise be ascertained within the scope of the aforementioned algorithm—in conjunction with the virtual object.

Further, it is also possible to treat, and likewise co-reconstruct, optical aberrations of the mask inspection apparatus, or else aberrations of the mask itself, as free parameters in the aforementioned algorithm. Furthermore, the above-described algorithm may also comprise known optimization methods such as, e.g., the so-called "compressed sensing" (e.g. within the meaning of a reduction to a sparsely occupied base).

As one of several possible and advantageous applications of the invention, there may be the calculation of at least one parameter characterizing the mask on the basis of carrying out a plurality of measurement steps while measuring different intensity distributions with the mask inspection apparatus in conjunction with a partly coherent reconstruction algorithm, which is explained in more detail below. A corresponding method is explained in more detail below with reference to the flowchart depicted in FIG. 3.

In further advantageous applications of the invention, the measurement of different intensity distributions in conjunction with ascertaining the electric field as a complex, partly coherent electric field may also be used to predict aerial images which are to be expected if at least one optical parameter is changed, wherein this optical parameter may be, e.g., the illumination setting used in the mask inspection apparatus or else optical aberrations of the mask inspection apparatus and/or of the projection exposure apparatus. The last-mentioned aspect may, in turn, comprise eliminating optical aberrations of the mask inspection system and/or adding optical aberrations of the projection exposure apparatus.

Referring to FIG. 3 again, the method according to the invention for ascertaining at least one parameter characteristic for the mask starts, as already mentioned, by carrying out a plurality of measurements of different intensity distributions, wherein these measurements may be carried out for different distances between mask and sensor arrangement, different illumination settings and/or different modifications of phase and/or amplitude in the pupil plane of the imaging beam path (step S310). The modification of the phase and/or amplitude in the pupil plane of the imaging beam path may be carried out in a manner known per se by using suitable amplitude masks (e.g. in the form of a stop or greyscale value filter) or a (e.g. laterally displaceable) phase mask.

Preferably, for the purposes of optimizing the accuracy of the method according to the invention, the control range of the sensor arrangement or camera is firstly selected so large that (nondeterministic) noise is minimized and secondly selected in such a way that there is a linear relationship between the intensity input into the sensor arrangement in each case and the sensor signal. Further, the nonlinearity of the sensor arrangement may also be determined first and then removed by calculation. Moreover, a plurality of measurements are carried out or different intensity distributions are recorded in such a way that sufficient information about the partly coherent light field is obtained. When a plurality of measurements are carried out for different distances between mask and sensor arrangement, e.g. the mask may be displaced along the optical system axis or light propagation direction over an overall travel of approximately 13 µm in increments of approximately 1 µm in each case, wherein respectively one aerial image is recorded after each individual displacement. Alternatively, there may also be a corresponding displacement of the sensor arrangement or camera, or of the projection lens, along the optical system axis or light propagation direction.

Figure 3:
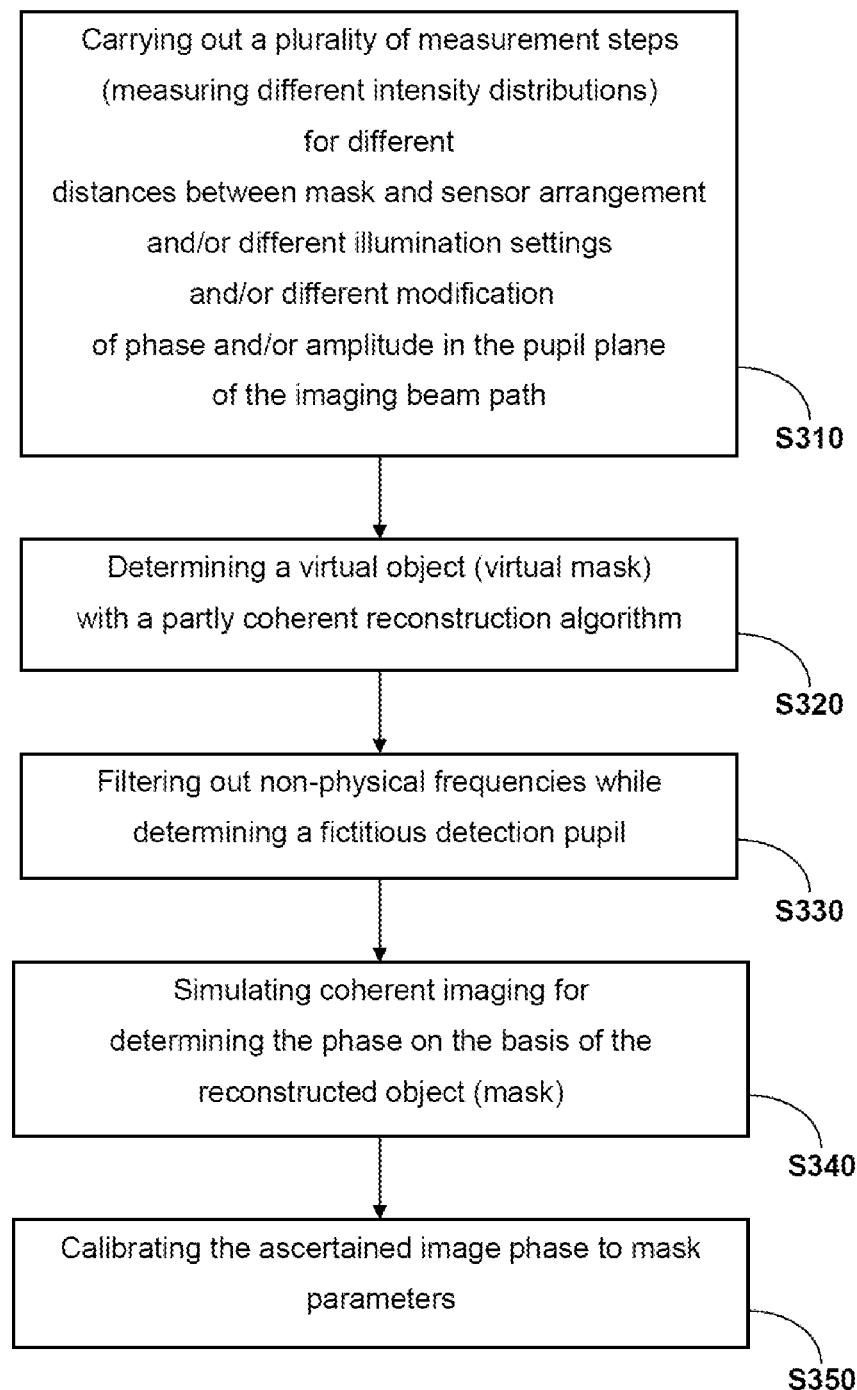
FIG. 3 shows a flowchart for explaining a possible embodiment of the method according to the invention.

A virtual object (i.e. a virtual mask) is determined in step S320 in accordance with FIG. 3 using the previously mentioned partly coherent reconstruction algorithm on the basis of the intensity distributions or aerial images ascertained thus.

Referring to FIG. 3 again, in step S330 there may be filtering out of non-physical frequencies while determining a fictitious detection pupil (i.e. a fictitious pupil plane in the imaging beam path). In the process, for example in the case of a monopole illumination setting with radius σ and a detection pupil with radius NA, there may be filtering out of the non-physical frequencies in said fictitious detection pupil by way of a virtual aperture stop with radius NA+σ. In further embodiments, it is also possible from the start only to reconstruct the physically meaningful component of the object spectrum when determining the virtual object in the aforementioned reconstruction algorithm.

In the subsequent step S340, coherent imaging for determining the phase on the basis of the reconstructed object is simulated on the basis of the reconstructed object (i.e. the reconstructed mask).

Subsequently, the ascertained (image) phase on the mask parameter is calibrated in step S350. As a result of this, it is possible to take account of the fact that the image phase of a structure with a given object phase does not necessarily correspond with the object phase (wherein, e.g., the image phase of a mask is dependent not only on the etching depth, but also on the edge steepness, edge rounding, corner rounding and line width variance, as well as the type of structure and the direct vicinity thereof). Furthermore, additional structures or "overshoots" in the image phase may occur in regions of an intrinsically substantially flat or homogeneous object phase. In the case of comparatively large structures (e.g. greater than 0.5 µm in the case of an operating wavelength of 193 nm and an NA of 0.35), there may be e.g. averaging of the image phase over a certain lateral region. In the case of comparatively small structures, there may be a noise-insensitive determination of the maximum of the image phase of the sought structure.

In further embodiments, the image phases of different object phases of the sought structure may be stored in a library or database for calibration purposes, wherein a comparison of the respectively reconstructed image phase with the stored image phases may be carried out.

Even though the invention has been described on the basis of specific embodiments, numerous variations and alternative embodiments are apparent to the person skilled in the art, e.g. by combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

What is claimed is:

1. A method for predicting the imaging result obtained with a mask when a lithography process is carried out, wherein the mask comprises mask structures to be imaged and the mask is destined to be illuminated in a lithography process in a projection exposure apparatus with a predetermined illumination setting for exposing a wafer comprising a photoresist, wherein the method comprises the following steps:
   a) measuring at least one intensity distribution obtained for the mask in the case of an illumination with illumination light in accordance with the illumination setting in a mask inspection apparatus using a sensor arrangement;
   b) ascertaining an electric field resulting from the interaction of the illumination light with the mask structures, both in respect of amplitude and in respect of phase, by way of this intensity measurement;
   c) calculating a mask model describing the refraction and/or reflection behavior of the mask on the basis of the ascertained electric field; and
   d) estimating an intensity distribution obtained in the photoresist when the lithography process is carried out on the basis of a mathematical simulation (forward calculation), in which the electric field ascertained in step b) is propagated in a layer system comprising at least the photoresist.

2. The method according to claim 1, wherein the layer system in step d) further comprises a wafer stack made of a plurality of layers forming the wafer.

3. The method according to claim 1, wherein the layer system in step d) further comprises an immersion medium.

4. The method according to claim 1, wherein the method further comprises the following step: predicting a final photoresist structure as a result of the lithography process on the basis of the at least one intensity distribution estimated in step d) and on the basis of an OPC model or resist model.

5. The method according to claim 1, wherein ascertaining the electric field resulting from the interaction of the illumination light with the mask structures in step b) comprises the taking account of optical aberrations of the mask inspection apparatus.

6. The method according to claim 1, wherein estimating the intensity distribution obtained in the photoresist when the lithography process is carried out in step d) comprises the taking account of optical aberrations of the projection exposure apparatus.

7. The method according to claim 1, wherein the electric field is ascertained in step b) as a partly coherent complex electric field.

8. The method according to claim 1, wherein the method further comprises the following step: calculating at least one parameter which characterizes the mask, on the basis of the ascertained electric field.

9. The method according to claim 8, wherein the at least one parameter which characterizes the mask describes the form or position of structures on the mask.

10. The method according to claim 1, wherein the method further comprises the following step: estimating an intensity distribution obtained in the photoresist when the lithography process is carried out, for an illumination setting which deviates from the predetermined illumination setting.

11. The method according to claim 1, wherein the method further comprises the following step: estimating an intensity distribution obtained in the photoresist when the lithography process is carried out, for a modified focal plane in the projection exposure apparatus.

12. The method according to claim 1, wherein the method further comprises the following step: calculating at least one further intensity distribution, which is to be expected for the mask in the mask inspection apparatus when at least one optical parameter is changed.

13. The method according to claim 1, wherein the mask is a mask designed for operation in transmission, in particular at an operating wavelength of less than 250 nm.

14. The method according to claim 1, wherein the mask is a mask designed for operation in reflection, in particular at an operating wavelength of less than 30 nm.

15. An appliance for predicting the imaging result obtained with a mask when a lithography process is carried out or for inspecting masks, wherein the mask comprises mask structures to be imaged and the mask is destined to be illuminated in a lithography process in a projection exposure apparatus with a predetermined illumination setting for exposing a wafer comprising a photoresist, wherein
the appliance is designed to carry out a method according to claim 1.

16. The method of claim 1 in which the electric field ascertained in step b) is propagated in a layer system comprising at least the photoresist and a wafer stack made of a plurality of layers forming the wafer, in which the mathematical simulation comprises calculating parameter values associated with a (j+1)-th layer based on parameter values associated with a j-th layer, $1 \leq j+1 \leq N$, N being the number of layers in the layer system.

17. The method of claim 16 in which the layer system in step d) further comprises an immersion medium, and the mathematical simulation comprises calculating parameter values associated with a layer after the immersion medium based on parameter values associated with the immersion medium.

18. The appliance of claim 15 in which the electric field ascertained in step b) is propagated in a layer system comprising at least the photoresist and a wafer stack made of a plurality of layers forming the wafer, in which the mathematical simulation comprises calculating parameter values associated with a (j+1)-th layer based on parameter values associated with a j-th layer, $1 \leq j+1 \leq N$, N being the number of layers in the layer system.

19. The appliance of claim 18 in which the layer system further comprises an immersion medium, and the mathematical simulation comprises calculating parameter values associated with a layer after the immersion medium based on parameter values associated with the immersion medium.

20. A method for inspecting masks, wherein the mask comprises mask structures to be imaged and the mask is destined to be illuminated in a lithography process in a projection exposure apparatus with a predetermined illumination setting for exposing a wafer comprising a photoresist, wherein the method comprises the following steps:
measuring at least one intensity distribution obtained for the mask in the case of an illumination with illumination light in accordance with the illumination setting in a mask inspection apparatus using a sensor arrangement;
ascertaining an electric field resulting from the interaction of the illumination light with the mask structures, both in respect of amplitude and in respect of phase, by way of this intensity measurement;
calculating a mask model describing the refraction and/or reflection behavior of the mask on the basis of the ascertained electric field; and
calculating at least one parameter which characterizes the mask, on the basis of the ascertained electric field;
wherein the at least one parameter which characterizes the mask describes the form or position of at least one structure on the mask, including at least one of (i) an etching depth of the structure, (ii) an edge steepness of the structure, (iii) an edge rounding of the structure, or (iv) a corner rounding of the structure.

21. The method according to claim 20, wherein ascertaining an electric field resulting from the interaction of the illumination light with the mask structures comprises the taking account of optical aberrations of the mask inspection apparatus.

22. The method according to claim 20, wherein the electric field is ascertained as a partly coherent complex electric field.

23. A method for inspecting masks, wherein the mask comprises mask structures to be imaged and the mask is destined to be illuminated in a lithography process in a projection exposure apparatus with a predetermined illumination setting for exposing a wafer comprising a photoresist, wherein the method comprises the following steps:
measuring at least one intensity distribution obtained for the mask in the case of an illumination with illumination light in accordance with the illumination setting in a mask inspection apparatus using a sensor arrangement;
ascertaining an electric field resulting from the interaction of the illumination light with the mask structures, both in respect of amplitude and in respect of phase, by way of this intensity measurement;
calculating a mask model describing the refraction and/or reflection behavior of the mask on the basis of the ascertained electric field; and
calculating at least one further intensity distribution, which is to be expected for the mask in the mask inspection apparatus when at least one optical parameter is changed.

24. The method according to claim 23, wherein this optical parameter describes the illumination setting used in the mask inspection apparatus.

25. The method according to claim 23, wherein the change of at least one optical parameter comprises the taking account of optical aberrations of the mask inspection apparatus and/or of the projection exposure apparatus.

26. The method according to claim 23, wherein the electric field is ascertained as a partly coherent complex electric field.

* * * * *